United States Patent [19]

Takigawa et al.

[11] Patent Number: 4,530,064
[45] Date of Patent: Jul. 16, 1985

[54] EXPOSURE METHOD UTILIZING AN ENERGY BEAM

[75] Inventors: Tadahiro Takigawa, Inagi; Yasunobu Kawauchi, Fussa, both of Japan

[73] Assignee: Tokyo Shibaura Denki Kabushiki Kaisha, Japan

[21] Appl. No.: 411,044

[22] Filed: Aug. 24, 1982

[30] Foreign Application Priority Data

Sep. 3, 1981 [JP] Japan .............................. 56-138762

[51] Int. Cl.³ .......................... G02B 27/00; G06F 3/14
[52] U.S. Cl. ..................................... 364/523; 364/491; 364/518; 378/35; 250/492.1; 250/492.2
[58] Field of Search ............... 364/518, 523, 490, 491; 250/396 ML, 358.1, 492.3, 492.2, 492.1; 378/34, 35; 340/724, 731, 745

[56] References Cited

U.S. PATENT DOCUMENTS 4,145,615  3/1979  Sumi ............................... 250/492 A
4,199,689  4/1980  Takigawa ....................... 250/492.2
4,280,186  7/1981  Hidai et al. ....................... 364/518

FOREIGN PATENT DOCUMENTS 135929  10/1981  Japan .................................. 364/518

OTHER PUBLICATIONS

Speth et al.; *Electron–Beam Lithography Using Vector-Scan Techniques;* Journal Vacuum Science Tech.; vol. 12, No. 6, (1975).

Sugiyama et al.; Data Processing System of Electron–Beam Lithography for VLSI Fabrication; IEEE Tran. Elect. Dev.; vol. ED26, No. 4, Apr. 1979.

*Primary Examiner*—Errol A. Krass
*Assistant Examiner*—Kevin J. Teska
*Attorney, Agent, or Firm*—Banner, Birch, McKie & Beckett

[57] ABSTRACT

According to the present invention, a simplified process is provided for drawing a picture pattern and an alignment pattern on a substrate at a scaling factor $\alpha$ by utilizing an energy beam exposure device. According to the invention, a scale conversion of $1/\alpha$ is first applied to the alignment mark patterns. The parameters of the exposure device such as beam diameter, beam scanning interval, beam scanning deflection amplitude, frequency division factor, and displacement velocity are altered in accordance with the desired scaling factor $\alpha$. The chip pattern data and the altered alignment mark data are then utilized together for drawing the pattern of the substrate without need for re-adjustment during the drawing process.

10 Claims, 8 Drawing Figures

(a) FIGURE ABCD (SCALED BY FACTOR K IN PG FORMAT):

$(X_0, Y_0, H_0, W_0, \theta) = (KX, KY, KH, KW, \theta)$ (b) FIGURE AED (IN EB FORMAT):

$$\begin{cases} X' = X_0 + \frac{1}{2} W_0 \cos\theta - H_0(\frac{1}{2}\sin\theta - \frac{\cos^2\theta}{\sin\theta}) \\ Y' = Y_0 + \frac{1}{2} W_0 \sin\theta - \frac{1}{2} H_0 \cos\theta \\ \ell' = H_0 \frac{\cos^2\theta}{\sin\theta} + H_0 \sin\theta \\ n_1' = H_0 \frac{\cos^2\theta}{\sin\theta} \\ n_2' = H_0 \sin\theta \\ h' = H_0 \cos\theta \end{cases}$$

(c) FIGURE EBFD (IN EB FORMAT):

$$\begin{cases} X'' = X_0 - \frac{1}{2}(W_0 \sin\theta + H_0 \cos\theta) \\ Y'' = Y_0 - \frac{1}{2}(W_0 \cos\theta - H_0 \sin\theta) \\ \ell'' = H_0(\frac{\cos^2\theta}{\sin\theta} + \sin\theta) \\ n_1'' = W_0 \cos\theta - \frac{H_0}{\sin\theta} \\ n_2'' = W_0 \cos\theta - \frac{H}{\sin\theta} \\ h'' = W_0 \cos\theta \sin\theta - H_0 \end{cases}$$

(d) FIGURE BCF (IN EB FORMAT):

$$\begin{cases} X''' = X_0 - \frac{1}{2}(W_0 \cos\theta - H_0 \sin\theta) \\ Y''' = Y_0 - \frac{1}{2}(W_0 \sin\theta + H_0 \cos\theta) \\ \ell''' = 0 \\ n_1''' = H_0 \sin\theta \\ n_2''' = H_0 \frac{\cos\theta}{\sin\theta} \\ h''' = H_0 \cos\theta \end{cases}$$

EXPOSURE METHOD UTILIZING AN ENERGY BEAM

BACKGROUND OF THE INVENTION

This invention relates to an exposure method utilizing an energy beam, such as an electron beam, for drawing a chip pattern on a substrate. More specifically, this invention relates to an exposure method incorporating a simplified process to scale a pattern for providing magnification or reduction of the pattern's size.

Recently, a method for manufacturing high integrated semiconductor devices has been widely employed whereby a reticle pattern drawn on a substrate by an electron beam exposure device is projected onto a semiconductor wafer by utilizing an optical size-reducing projector. The projecting process is repeated until a plurality of chips are formed on the wafer, each chip contiguously positioned with respect to its adjacent chips. To improve wafer yield, it is necessary to reduce the area of each chip in order to permit as many LSI chips as possible to be cut from the wafer. Consequently, LSI chips can be produced which are multiples (e.g., 1, 0.9, 0.8) of original pattern; the smallest multiple which performs properly is then selected as the mask pattern used for actual production. In producing reticles at different magnifications such as 1×, 0.9× or 0.8× etc., (hereinafter called scaling factor $\alpha$), each different reticle is required to have alignment marks of the same size. Since the size and position of these alignment marks are unique for the particular optical reduction projector used, they must have the same size and position despite the use of different scaling factors. The conventional method separates the drawing of the chip pattern from the drawing of the alignment marks. This conventional method involves manufacturing a scaled reticle, having a given scaling factor $\alpha$, from original pattern data in accordance with the following steps (1)-(3):

(1) The drawing parameters of the electron beam exposure device are converted by the desired scaling factor $\alpha$. That is, the diameter d of the electron beam is adjusted to be $\alpha d$; the deflection amplitude a of the electron beam is adjusted to be $\alpha a$; the beam scan interval i is adjusted to be $\alpha i$; a frequency division factor m is selected to be approximately equal to $\alpha n d/\lambda$, where $\lambda$ is a wavelength of laser light emitted by a laser interfermeter for measuring the x-y table displacement and n is an integer; and x-y table displacement velocity v is adjusted to be $\alpha v$;

(2) A chip pattern is drawn on the reticle with chip pattern data;

(3) The electron beam diameter d, deflection amplitude a, beam scan interval i, frequency division factor m and x-y table displacement velocity v are then re-adjusted with the scaling factor equal to 1, and the alignment mark pattern is finally drawn. This necessary re-adjustment of the parameters during the middle of the drawing cycle, however, adversely effects the accuracy of the drawn patterns. Moreover, this additional procedure is time-consuming and will effect the output yield.

SUMMARY OF THE INVENTION

It is an object of the present invention to provide an exposure method utilizing an energy beam whereby high precision scaling is obtained in a simplified manner.

It is another object of the present invention to provide an exposure method utilizing an energy beam whereby re-adjustment of the exposure device parameters during the middle of the drawing procedure is not required.

According to the present invention, a scale conversion of $1/\alpha$ is first applied to the alignment marks data. Then, the drawing parameter of the exposure device such as beam diameter, beam scanning interval, beam scanning deflection amplitude, frequency division factor and displacement velocity are adjusted in accordance with the desired scaling factor $\alpha$. The chip pattern data and the converted alignment mark data are then supplied together to the exposure device for drawing a pattern on the substrate without the need for re-adjustment during the drawing process.

BRIEF DESCRIPTION OF THE DRAWINGS

FIG. 3 is a diagram showing the picture patterns to be drawn according to the method of the invention whereby

DESCRIPTION OF THE PREFERRED EMBODIMENT

Figure 1:
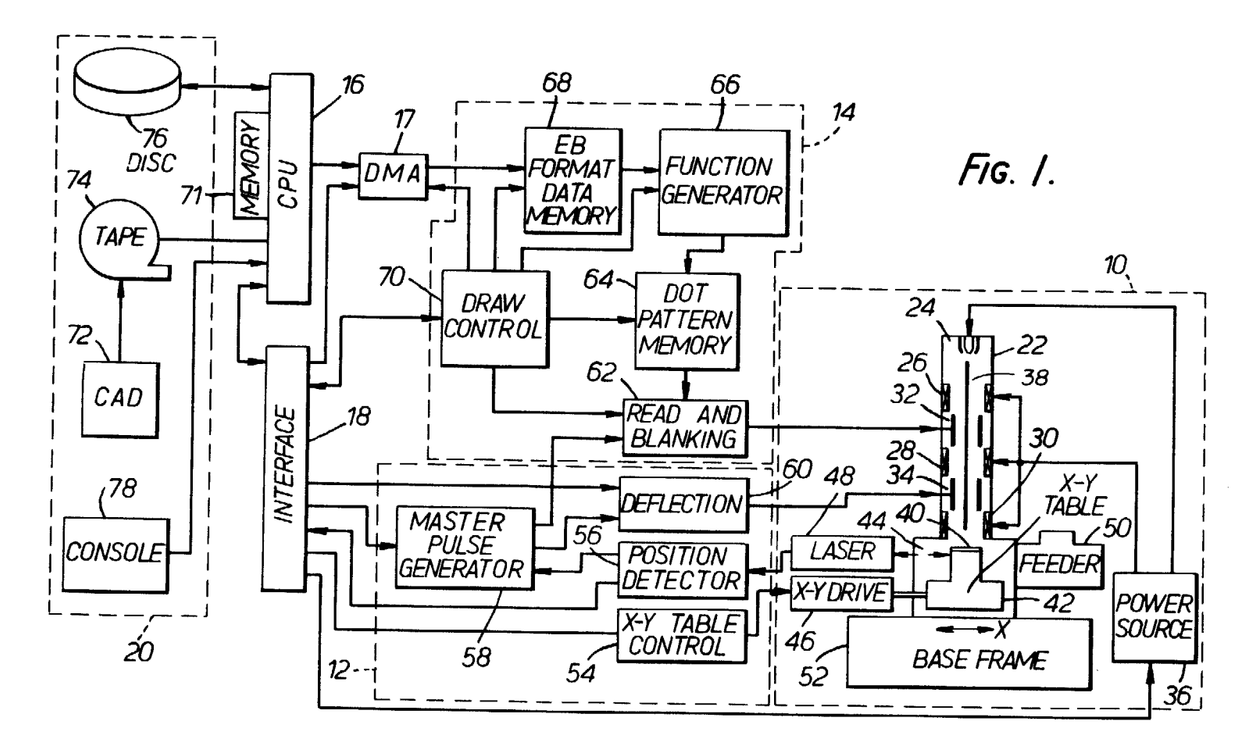
FIG. 1 is a block diagram showing an electron beam exposure device which is used to practice the method of the present invention.

FIG. 1 shows a block diagram of an electron beam exposure system utilized to practice the method of the invention. This sytem consists of several conventional units including a machine unit 10, a machine control unit 12, a pattern generating unit 14, a computer unit 16, a direct memory access unit 17, an interface unit 18 and an input unit 20. The disclosure and operation of these units are fully explained in Toshiba Review No. 119, "Electron Beam Exposure System For LSI Mark and Reticle Fabrication" (Jan.-Feb. 1979, pp 2-7); see also the commonly assigned U.S. Pat. No. 4,280,186, which is incorporated herein by reference.

Machine unit 10 includes an electron optics system installed in an evacuated column 22. Column 22 is shown in cross-section. The electron optics system comprises an electron gun 24, a first, second and third electron lenses 26, 28, 30, a blanking electrode 32 and a deflection electrode 34. Electron lenses 26, 28 and 30 are formed by circular coils which generate magnetic flux along the vertical axis of column 22. Lenses 26, 28 and 30 receive energizing current from a power source 36. These lenses operate to collimate electron beam 38 emitted from electron gun 24 for forming a drawing spot on the surface of a work piece 40, such as a mask substrate. The electron beam is blanked at one point and then unblanked at another point by blanking electrode 32 in response to dot pattern signals supplied from a pattern generating unit 14. Deflection electrode 34 cyclically deflects electron beam 38 along the X direction to produce a raster scan. Work piece 40 is carried by an X-Y table 42, positioned within a writing chamber 44, and is moved by a drive system 46 in the X and Y directions. A laser interferometer 48 is provided for measuring the displacement of X-Y table 42. An autofeeding chamber 50 is provided for automatically feeding the work pieces positioned on the X-Y table. Autofeeding chamber 50, column 22, writing chamber 44 are supported on an antivibration pedestal 52.

Machine control unit 12 includes an X-Y table control circuit 54 for controlling the operation of drive system 46 to continuously move X-Y table 42 in the Y direction and move it stepwise in the X direction. During movement in the Y direction, electron beam 38 is deflected in the X direction and a stripe region on the surface of workpiece 40 is scanned by the electron beam. By moving X-Y table 42 one step in the X direction, the next adjacent stripe region is scanned by the electron beam. An output signal from laser interferometer 48 is supplied to a position detection circuit 56. Laser interferometer 48 emits a pulse each time X-Y table 42 advances by the length $\lambda/n$ (where $\lambda$ is the wavelength of the laser and n is an integer unique to the particular interferometer used). Integer n, for example, is equal to 80 in the case of a very high resolution laser interferometer which is commercially available.

The output pulses of the detection circuit are supplied to a master pulse generator 58. Master pulse generator 58 comprises a frequency division circuit having a frequency division factor m supplied by computer unit 16 via interface unit 18. Master pulse generator 58 generates master pulses for dividing the output pulse frequency of laser interferometer 48 by frequency division factor m. Factor m is selected by the computer as the closest integral value to $nd/\lambda$ so that the electron beam advances during each scanning period by one spot length (i.e., the diameter d) in response to each clock pulse from the master pulse generator. The master pulse is supplied to trigger a deflection circuit 60, so that both the mechanical X-Y table displacement and beam scanning are synchronized. Deflection circuit 60 is also controlled by computer unit 16 via interface unit 18 so that deflection amplitude i.e., a, beam scan interval and the other parameters can be altered in accordance with the computer's instructions.

The master pulse is also supplied to trigger a read and blanking circuit 62 in pattern generating unit 14. Read and blanking circuit 62 blanks or unblanks the electron beam in accordance with dot pattern signals read from dot pattern memory 64. Dot pattern memory 64 temporarily stores the circuit pattern to be printed in the form of a dot pattern. The dot pattern is converted from a special pattern data format, called EB format, in which a trapezoid is used as an unit figure, as will be explained. EB format data is temporarily stored in a EB format data memory 68 and then supplied to function generator 66 which converts the EB pattern data to dot patterns. A draw control circuit 70 is provided for controlling the operation of pattern generating unit 14 in accordance with the command from computer unit 16 via interface unit 18.

Figure 5:
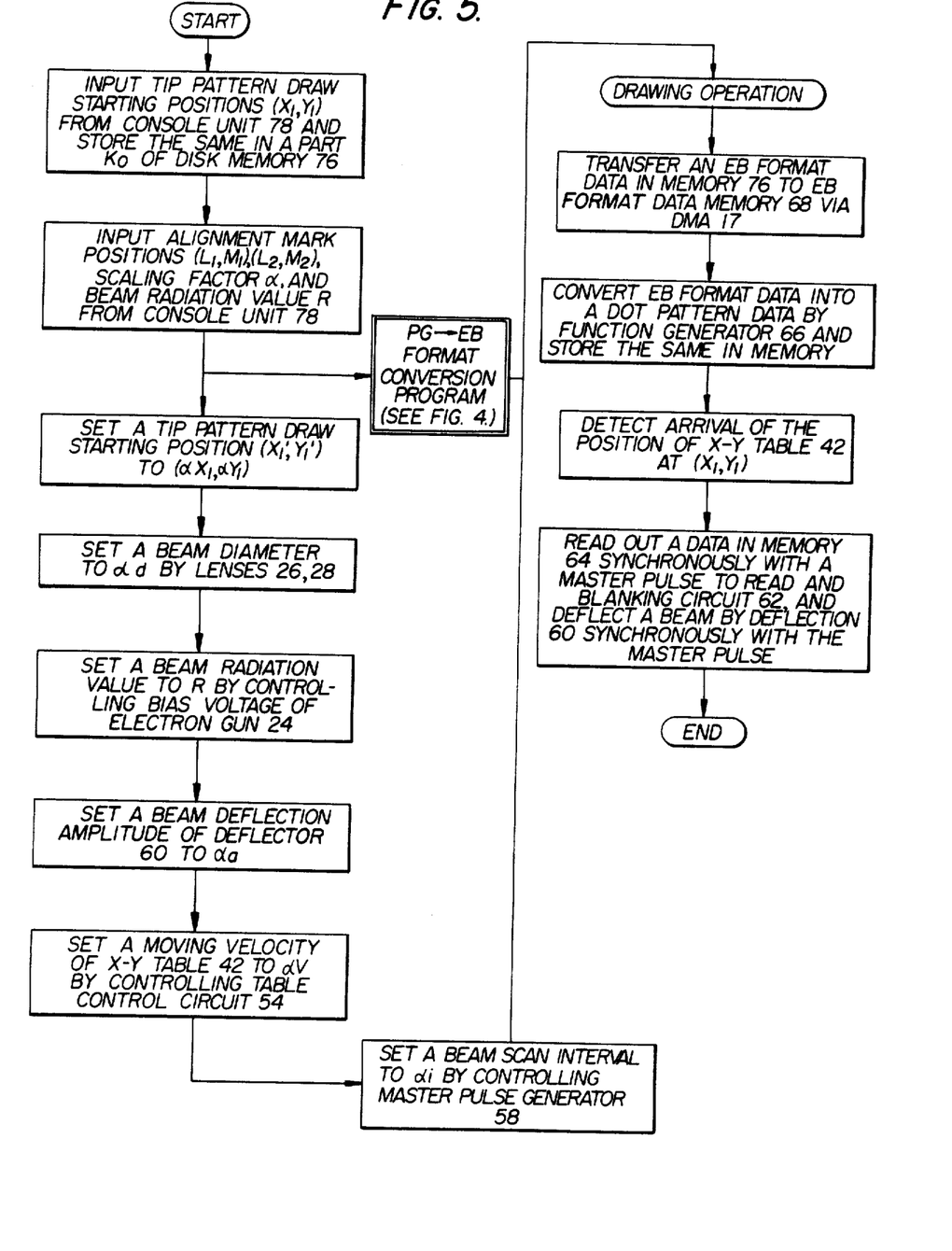
FIG. 5 is a flow chart showing the operation of the elements in FIG. 1.

Computer unit 16 controls the system through interface unit 18. A flow chart of the control program is shown in FIG. 5. A direct memory access unit 17 is provided to transfer pattern data directly from a main memory 71 to pattern generating unit 14.

Input unit 20 comprises a computer aided design system 72 (hereinafter called CAD system), a magnetic tape memory 74, a magnetic disc memory 76 and a console unit 78. CAD system 72 is used to design the chip pattern. Pattern data generated by CAD system 72 representing an original designed pattern is stored in magnetic tape memory 74. This pattern data generated by CAD system 72 is recorded in another special format, called PG format, wherein a rectangle is used as the unit figure, as will be explained. PG format data is then converted to EB format data by computer unit 16 with the aid of a conversion program stored in main memory 71 of the computer. The resulting EB format data is then stored in magnetic disc memory 76. Console unit 78 is used to give the exposure system various kinds of instructions such as pattern drawing start position, alignment mark position, scaling factor and so on. Detailed explanation of the PG and EB format of this system is disclosed in U.S. Pat. No. 4,280,186.

Figure 2A:
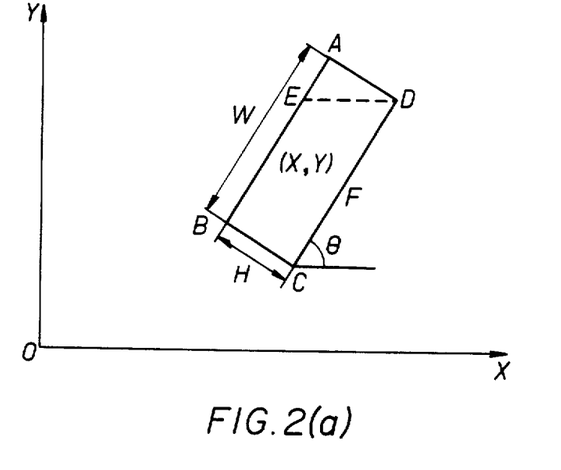
FIG. 2 is a diagram explaining the PG format data system FIG. 2(a) and the EB format data system FIG. 2(b) used with the device shown in FIG. 1.
Figure 2B:
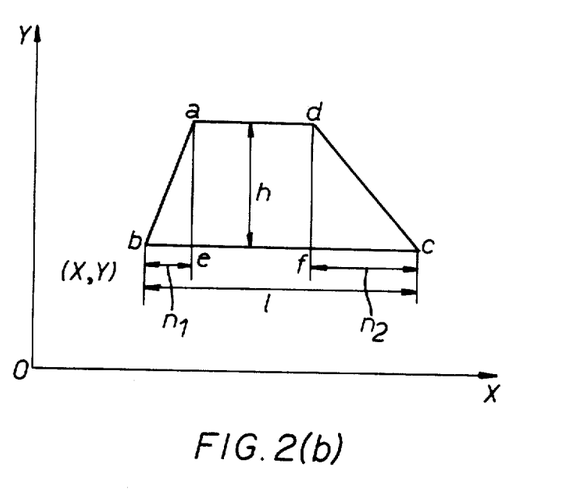

The conversion of the format will now be explained. FIG. 2(a) shows a unit figure ABCD of PG format data, and FIG. 2(b) shows a unit figure abcd of EB format data. In PG format data, a rectangle ABCD is represented by a set of data consisting of X, Y, W, H and $\theta$. Data (X, Y) represents the position of the center of the rectangle, W and H represent the length of adjacent sides of the rectangle, and $\theta$ represents the angle between one side of the rectangle and X axis as shown in FIG. 2(a). In this format, all types of patterns can be represented by using sets of data representing the unit rectangle. With the EB format, on the other hand, a trapezoid a b c d is represented by a set of data consisting of X, Y, l, $N_1$, $n_2$ and h. Here data (X, Y) represent the position of point b, l represents the length between points b and c, $n_1$ represent the length between points b and e; $n_2$ represents the length between points f and c; and h represents the height of the trapezoid. In this format, all types of pattern can be represented by using sets of data representing the unit trapezoid. For example a triangle is represented by a set of data $X_1$, X, Y, l, $n_1$, $n_2$ and h, where $n_1 + n_2 = l$. A square can be represented by a set of data, where $n_1 = n_2 = 0$.

Figure 6:
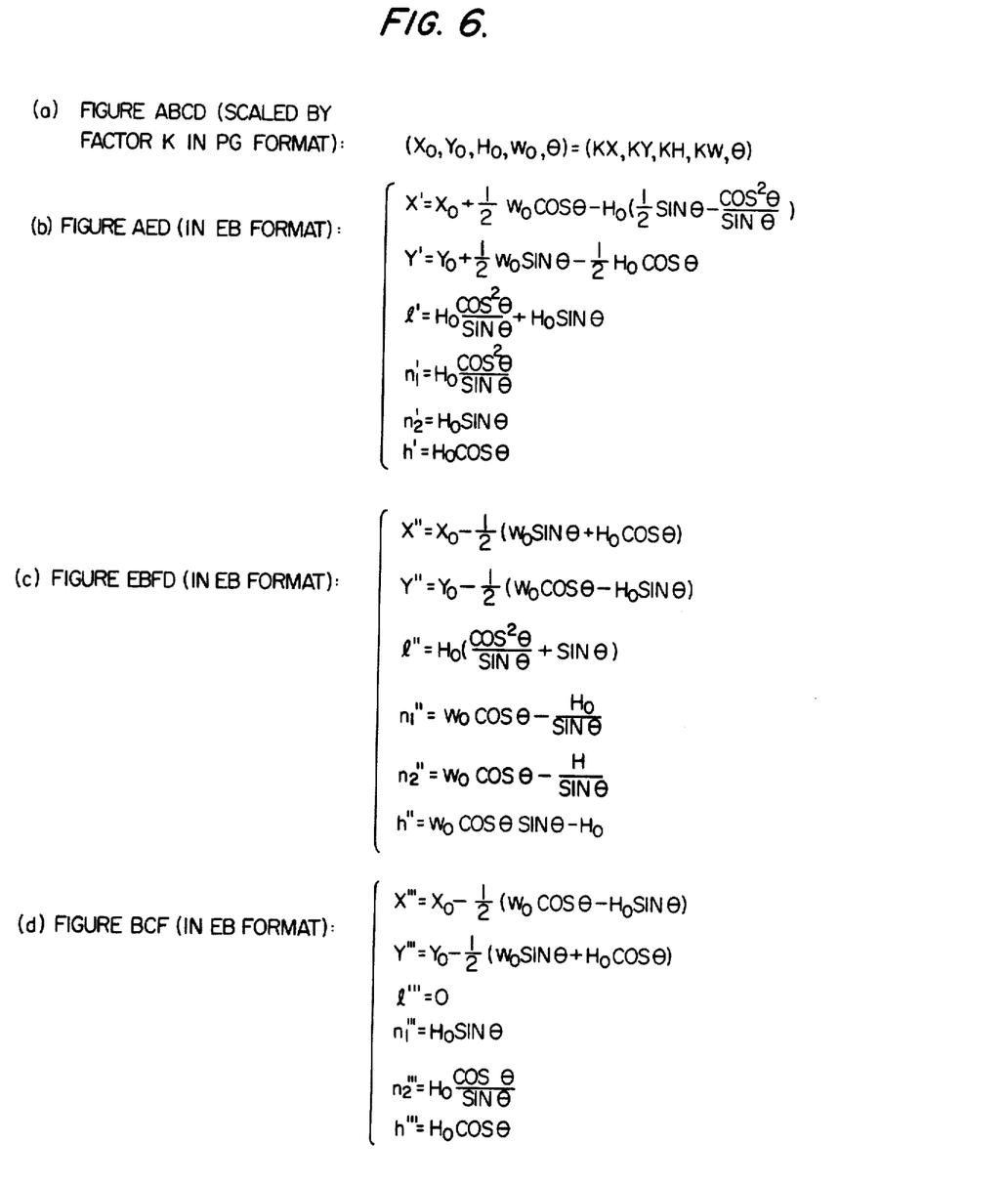
FIG. 6 is a table showing the conversion equations used by the flow chart in FIG. 4.

Conversion from PG format to EB format is conducted as follows. As shown in FIG. 2(a), a pattern represented by PG format is divided into trapezoid unit figures AED, EBFD and BCF. Thus, the rectangle ABCD represented as (X, Y, W, H, $\theta$) by PG data is converted into three sets of EB data (X, Y, l, $n_1$, $n_2$, h) representing three subregions AED, EBFD and BCF. A flow chart of a conversion program for converting from PG format to EB format is set forth in FIG. 4. The program starts in step 1 and proceeds to step 2 where scaling factor $\alpha$ is set to 1. The program then proceeds to step 4 where one set of PG format data is read from magnetic tape memory 74 shown in FIG. 1. This data is supplied to step 5 where it is converted to EB format using the conversion equations shown in the table in FIG. 6. In step 6, the EB format data is stored in a portion $K_1$ of magnetic disk memory 76 shown in FIG. 1. Step 7 determines whether all pattern data has been read. If all data has not been read, the program returns to step 4. If all data has been read, however, the program proceeds to step 8 where a decision is made whether all alignment mark pattern data has been read. If all alignment mark data has been read, the conversion is complete. If all alignment mark data has not been read, however, as will be the case when step 8 is entered for the first time, scaling factor $\alpha$ is set to $1/\alpha$ in step 9. The program then proceeds to step 3 and loops through steps 4, 5, 6, 7 and 8 until all alignment mark data has been read out. As is apparent from the format conversion program, alignment mark positions ($L_1$, $M_1$), ($L_2$, $M_2$) and alignment mark pattern data (W, H) are multiplied by $1/\alpha$ and stored in a portion $K_1$ of magnetic disk memory 76. Picture pattern data (chip pattern data) is read out from magnetic tape memory 74 prior to the alignment data and is multiplied by 1 and stored in portion $K_1$ of magnetic disk memory 76.

Figure 4:
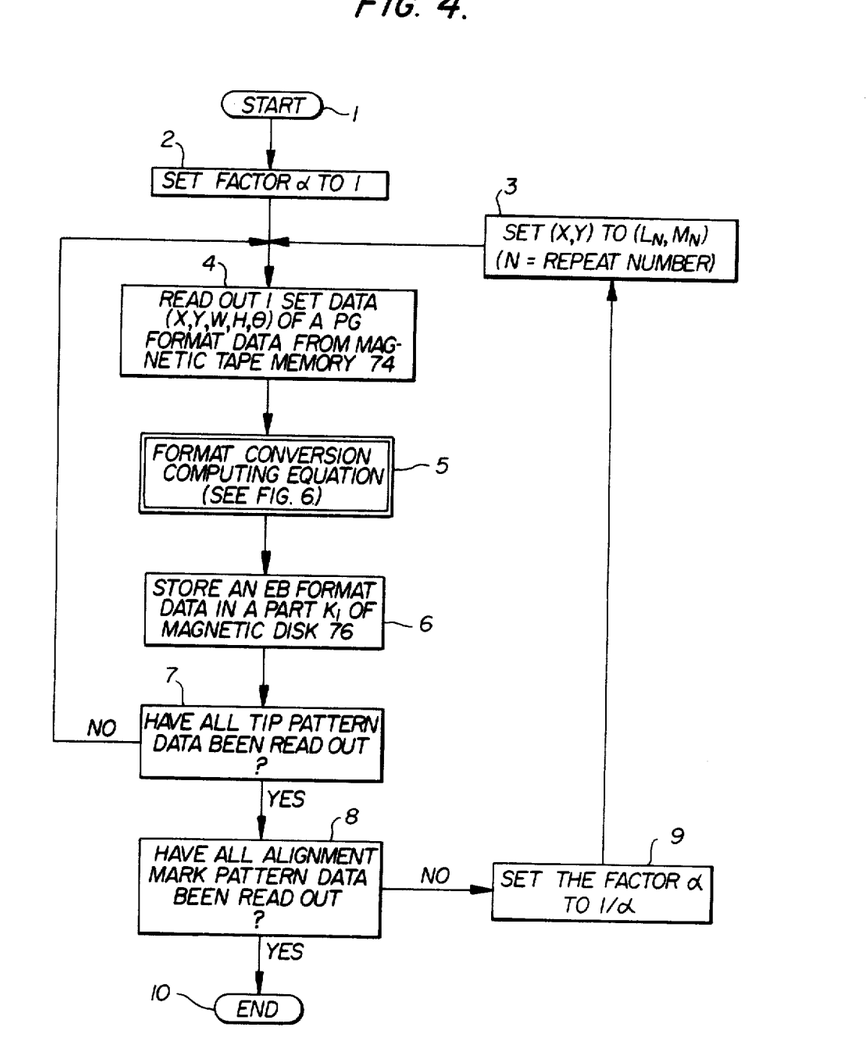
FIG. 4 is a flow chart showing the conversion from PG to EB format.

Note that in block 4, all pattern data is read followed by all alignment mark pattern data. Also, with respect to block 4, the alignment mark position data (X, Y) in the PG format is not necessary. This is because alignment mark position data ($L_1$, $M_1$), ($L_2$, $M_2$) is input from console unit 78.

Data conversion for converting the size of the figures (hereinafter called as scale conversion) is conducted for each alignment mark pattern PG data (X, Y, H, W, $\theta$) by multiplying each data word by scaling factor $1/\alpha$. Thus, the PG data word (X, Y, H, W, $\theta$) is converted to: $1/\alpha$ X, $1/60$ Y, $1/\alpha$ H, $1/\alpha$ W, $\theta$. This data represents a rectangle having the same shape and angle as the original data word but with a different size. Conversion into a different format (e.g., into EB format data) occurs after the scale conversion is conducted. The two kinds of conversions, scale conversion and format conversion, are conducted by the computer under the control of the conversion programs.

Figure 3A:
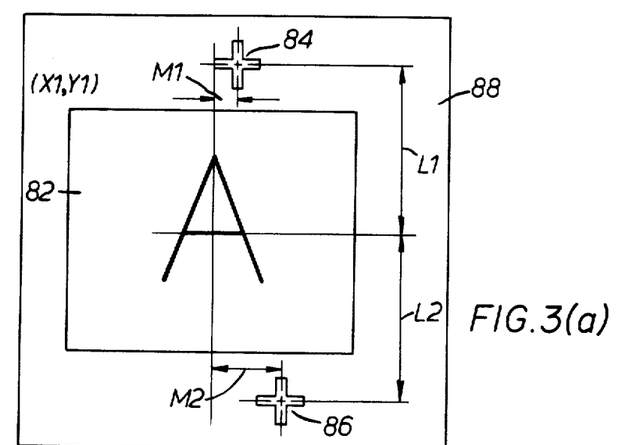
FIG. 3(a) is a picture pattern with scaling factor $\alpha = 1$.
Figure 3B:
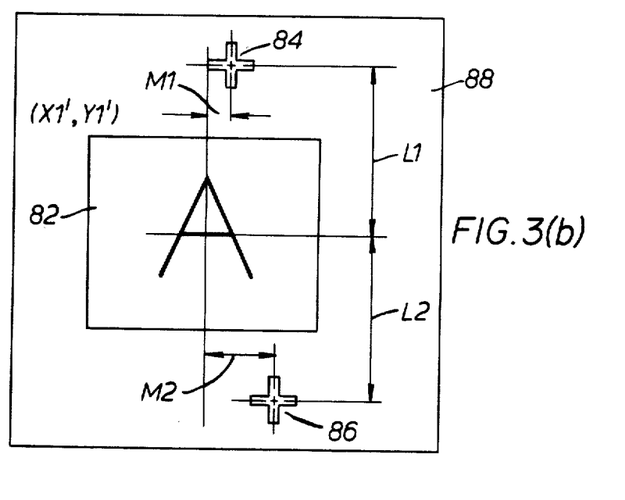
FIG. 3(b) is a picture pattern with scaling factor $\alpha = 0.8$.

The drawing operation will now be explained for the case where a pattern is drawn in accordance with the scale conversion of the invention. FIG. 3 schematically shows an example of a reticle pattern to be drawn using a method according to the invention. FIG. 3(a) is an original reticle pattern (i.e., at a scaling factor $\alpha=1$), and FIG. 3(b) is a reticle pattern at a scaling factor $\alpha=0.8$. Shown in FIGS. 3(a) and 3(b) are a picture pattern 82 and alignment mark patterns 84, 86 which are to be drawn on a mask substrate 88. The size and position of the alignment marks are specifically determined by the particular optical reduction projector used. As discussed, the scale conversion method must not adversely effect the size and pattern of the alignment marks so that accurate reproduction of the picture pattern on the semiconductor wafers can occur.

The original pattern shown in FIG. 3(a) is designed using CAD system 72 and PG format data representing the desired pattern. This PG format output data is temporarily stored in magnetic tape memory 74. Inputted from console unit 78 are the draw start position ($X_1$, $Y_1$) of the chip pattern, the alignment mark positions ($L_1$, $M_1$)($L_2$, $M_2$), the scaling factor $\alpha$, and the desired amount of beam radiation. Upon inputting $\alpha$, computer unit 16 reads out the chip pattern data from magnetic tape memory 74 and converts it into EB format data at a scaling factor 1 (i.e., $\alpha=1$). The EB format data thus obtained is stored in magnetic disc memory 76. The computer then reads the alignment mark pattern data from magnetic tape memory 74 and converts it into EB format data at a scaling factor $1/\alpha$. The converted data is similarly stored in disc memory 76. Simultaneously, the drawing parameters of the electron beam exposure device are converted by the desired scaling factor $\alpha$. That is, electron beam diameter $\alpha d$, beam deflection amplitude $\alpha a$, beam scan interval $\alpha i$, X-Y table displacement velocity $\alpha v$, frequency division factor $\alpha m$ and the other parameters are calculated by computer unit 16 corresponding to the desired scaling factor $\alpha$ inputted from console unit 18. The parameters of the electron beam exposure device are thereby set and the device is ready for drawing.

Draw control circuit 70 transfers a set of EB format data, including both the picture pattern data and alignment mark pattern data, from magnetic disc memory 76 to EB format data memory 68 through direct memory access unit 17. Function generator 66 then reads out the contents of memory 68, by reading one subregion at a time, and converts the EB format data into the dot pattern data. The dot pattern data is then stored in dot pattern memory 64. An example of this function generator is disclosed in the U.S. Pat. No. 4,280,186. During this process, the drawing start position ($X'_1$, $Y'_1$) shown in FIG. 3(b) is calculated by computer unit 16 in accordance with the picture pattern data, so that the center of the picture pattern is aligned with the center of the substrate or the center of the drawing area of the electron beam exposure device. X-Y table 42 is driven by X-Y driver 46 controlled by X-Y table control circuit 56. When X-Y table 42 is detected to arrive at position ($X'_1$, $Y'_1$) by position detection circuit 56, readout and blanking circuit 62 begins reading the contents of dot pattern memory 64 and supplies blanking signals to blanking electrode 32 under the control of draw control circuit 70. The drawing is now effected at scaling factor $\alpha$. Since the parameters were calculated at the desired scaling factor, the picture pattern is drawn at a scaling factor $\alpha$. However, since the alignment mark data was converted at a scaling factor $1/\alpha$, the alignment marks are drawn at scaling factor 1 (i.e. their actual size).

Thus with the method of the invention, picture or chip patterns can be drawn at a scaling factor while their alignment marks are drawn at their actual size. The method permits this operation without separating the drawing of the chip pattern from the drawing of the alignment marks. It is therefore, unnecessary to change the scaling factor while the drawing operation is in progress; consequently, the drawing time is shortened, while drawing precision is obtained.

Although illustrative embodiments of the present invention have been described in detail with reference to the accompanying drawings, it should be understood that the invention is not limited to those precise embodiments and that various changes or modifications may be effected therein by one skilled in the art without departing from the scope or spirit of the invention. For example, the method employed is not limited to the above described continuous moving table type electron beam exposure device shown in FIG. 1. The method can also be practiced with a step by step moving table or a device utilizing vector scanning instead of raster scanning. The method of the invention may be utilized with a system other than an electron beam type, for example ion beam, light beam or some other energy beam can be utilized to draw a picture pattern on the substrate.

This invention is not limited to the manufacture of reticles but is applicable to the manufacture of semiconductor devices in which circuit patterns are directly drawn on a semiconductor wafer by an energy beam exposure device.

In the embodiment mentioned above, the scale conversion was applied to PG format data, but it can also be applied to EB format data after the format conversion. It should be understood, however, that format conversion is not always necessary to practice the method of the invention. The PG format data may be provided directly to function generator 66 shown in FIG. 1 in some cases.

We claim:

1. A method for controlling the drawing of a scaled pattern on a substrate from original pattern data comprising picture data and alignment data in accordance with drawing operation parameters of an energy beam exposure device at a desired scaling factor α, comprising the steps of:
    altering the scale of the alignment data by a factor of 1 α to produce scaled alignment data;
    altering the drawing operation parameters by the factor α to produce scaled drawing operation parameters; and
    drawing said picture data and said scaled alignment data in accordance with said scaled drawing operation parameters.

2. The method according to claim 1, wherein said original pattern data is provided by a computer aided design system.

3. The method according to claim 1, wherein said original pattern data is expressed in one data format and is then converted to another data format which is more suitable for operation of the energy beam exposure device.

4. The method of claim 3, wherein said one data format is PG data format whereby a rectangle is used as the unit figure and said other data format is EB format whereby a trapezoid is used as the unit figure.

5. The method according to claim 4, wherein the step of altering the alignment data involves altering alignment data expressed in said PG data format.

6. The method according to claim 1, wherein said substrate is a mask substrate.

7. The exposure method according to claim 1, wherein said substrate is a semiconductor wafer.

8. The method according to claim 1, wherein the substrate is placed on a moving table and the energy beam is scanned along the surface of said substrate for drawing the picture data and scaled alignment data.

9. The method according to claim 8, wherein said table moves continuously in one direction and said energy beam is scanned in a raster scan manner.

10. The method according to claim 1, wherein the picture data is an integrated circuit pattern data.

* * * * *

UNITED STATES PATENT AND TRADEMARK OFFICE
CERTIFICATE OF CORRECTION

PATENT NO.  : 4,530,064
DATED       : July 16, 1985
INVENTOR(S) : Tadahiro Takigawa et al.

It is certified that error appears in the above-identified patent and that said Letters Patent is hereby corrected as shown below:

On the title page, Item (73) should read

-- (73) Assignees: Tokyo Shibaura Denki Kabushiki Kaisha, Kawasaki-Shi, and Toshiba Machine Company, Ltd., Tokyo, Japan --.

Signed and Sealed this

Twenty-sixth Day of November 1985

[SEAL]

Attest:

DONALD J. QUIGG

Attesting Officer

Commissioner of Patents and Trademarks